US010541715B1

(12) United States Patent
Lin

(10) Patent No.: US 10,541,715 B1
(45) Date of Patent: Jan. 21, 2020

(54) DUAL-MODE WIRELESS TRANSCEIVER DEVICE

(71) Applicant: REALTEK SEMICONDUCTOR CORP., Hsinchu (TW)

(72) Inventor: Wei-Chen Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/371,602

(22) Filed: Apr. 1, 2019

(30) Foreign Application Priority Data

Jul. 25, 2018 (TW) .............................. 107125794 A

(51) Int. Cl.
| H04B 1/401 | (2015.01) |
| H03F 3/45 | (2006.01) |
| H03F 1/56 | (2006.01) |
| H04W 88/06 | (2009.01) |

(52) U.S. Cl.
CPC .............. H04B 1/401 (2013.01); H03F 1/56 (2013.01); H03F 3/45 (2013.01); *H03F 2200/222* (2013.01); *H03F 2200/387* (2013.01); *H03F 2203/45151* (2013.01); *H03F 2203/45526* (2013.01); *H04W 88/06* (2013.01)

(58) Field of Classification Search
CPC ... H04B 1/401; H03F 1/56; H03F 3/45; H03F 2200/222; H03F 2203/45526; H03F 2203/45151; H03F 2200/387; H04W 88/06
See application file for complete search history.

(56) References Cited

U.S. PATENT DOCUMENTS

| 5,794,159 A | 8/1998 | Portin |
| 6,009,130 A | 12/1999 | Lurey et al. |
| 7,251,459 B2 * | 7/2007 | McFarland .......... H03H 7/0153 455/101 |
| 7,463,864 B2 * | 12/2008 | Vassiliou ................. H04B 1/30 455/102 |
| 7,587,222 B2 * | 9/2009 | Trachewsky ......... H04B 1/0003 370/278 |

(Continued)

OTHER PUBLICATIONS

"Active electronic filter implementation", Wikipedia, Mar. 7, 2019, Total 5 pages.

*Primary Examiner* — Lewis G West
(74) *Attorney, Agent, or Firm* — Birch, Stewart, Kolasch & Birch, LLP

(57) ABSTRACT

A wireless transceiver device includes an operation amplification circuit, a transmitter circuit, a receiver circuit, and a transceiver control circuit. The operation amplification circuit, according to a rate parameter and a filtering parameter, filters and amplifies an input signal and outputs a processed signal. The transmitter circuit selectively uses a first ratio or second ratio as the amplification parameter, converts an input signal into an analog signal, inputs the analog signal into the operation amplification circuit, mixes the processed signal with a local oscillating frequency and then output an output signal. The receiver circuit mixes an external signal with another local oscillating frequency, inputs the mixed signal into the operation amplification circuit, and converts the processed signal into a digital signal. The transceiver control circuit selectively and electrically connects the operation amplification circuit with the transmitter circuit or the receiver circuit.

16 Claims, 4 Drawing Sheets

(56) References Cited

U.S. PATENT DOCUMENTS

| | | | | |
|---|---|---|---|---|
| 7,643,848 B2* | 1/2010 | Robinett | ............... | H04B 1/006 |
| | | | | 455/103 |
| 8,903,343 B2* | 12/2014 | Holenstein | ............... | H04B 1/16 |
| | | | | 455/132 |
| 2002/0193140 A1* | 12/2002 | Behrens | ............... | H04B 1/0003 |
| | | | | 455/553.1 |
| 2005/0148361 A1* | 7/2005 | Higuchi | ............... | H04M 1/72 |
| | | | | 455/553.1 |
| 2005/0186986 A1* | 8/2005 | Hansen | ............... | H04L 1/0057 |
| | | | | 455/553.1 |
| 2005/0227631 A1* | 10/2005 | Robinett | ............... | H04B 1/006 |
| | | | | 455/83 |
| 2007/0030116 A1* | 2/2007 | Feher | ............... | H04M 3/382 |
| | | | | 340/5.53 |

\* cited by examiner

DUAL-MODE WIRELESS TRANSCEIVER DEVICE

CROSS-REFERENCE TO RELATED APPLICATION

This non-provisional application claims priority under 35 U.S.C. § 119(a) to patent application Ser. No. 10/712,5794 in Taiwan, R.O.C. on Jul. 25, 2018, the entire contents of which are hereby incorporated by reference.

BACKGROUND

Technical Field

The present disclosure relates to a wireless signal transceiver device, and in particular, to a device for receiving/transmitting two different wireless signals.

Related Art

A wireless area network (Wi-Fi) and Bluetooth (Bluetooth) are two wireless communications technology standards that are commonly used by mobile devices, and are almost standard configurations for the mobile devices. To meet the requirements of the market, some people working in this industry manufacture Wi-Fi and Bluetooth, the two wireless communications technology standards, into a single chip.

The Wi-Fi communications technology and the Bluetooth communications technology are implemented on a circuit, and each circuit generally includes an antenna, a transceiver switch, a filter, an amplifier, and corresponding passive elements. Therefore, when the single chip includes Wi-Fi and Bluetooth functions, all the components described above need to be designed on the chip, and an overall area of the chip is increased. This is contradictory with a tendency that the chip needs to be manufactured increasingly small. Additionally, because Wi-Fi and Bluetooth each are an independent circuit, the chip needs much and complex control.

SUMMARY

In view of the foregoing description, this disclosure provides a dual-mode wireless transceiver device, adapted to receive and transmit signals of two different wireless communications technology standards.

According to some embodiments, the dual-mode wireless transceiver device includes a digital-to-analog conversion circuit, a second mixer circuit, a filter amplifier circuit, a first mixer circuit, an analog-to-digital conversion circuit, and a transceiver control circuit.

The digital-to-analog conversion circuit is adapted to be operated in a first mode and a second mode. In the first mode, the digital-to-analog conversion circuit is configured to convert a first input signal into an input analog signal. In the second mode, the digital-to-analog conversion circuit is configured to convert a second input signal into the input analog signal.

The second mixer circuit is adapted to be operated in a third mode and a fourth mode. In the third mode, the second mixer circuit is configured to mix a first external signal and a third local frequency to output an intermediate-frequency signal. In the fourth mode, the second mixer circuit is configured to mix a second external signal and a fourth local frequency to output the intermediate-frequency signal.

The filter amplifier circuit is adapted to be operated in the first, the second, the third, and the fourth mode. In the first and the second mode, the filter amplifier circuit is configured to filter and amplify the input analog signal to output a processed signal. In the third and the fourth mode, the filter amplifier circuit is configured to filter and amplify the intermediate-frequency signal to output the processed signal.

The first mixer circuit is adapted to be operated in the first and the second mode. In the first mode, the first mixer circuit is configured to mix the processed signal and a first local frequency to output an output signal. In the second mode, the first mixer circuit is configured to mix the processed signal and a second local frequency to output the output signal.

The analog-to-digital conversion circuit is adapted to be operated in the third and the fourth mode. The analog-to-digital conversion circuit is configured to convert the processed signal into a digital signal.

The transceiver control circuit is configured to control the digital-to-analog conversion circuit, the second mixer circuit, the filter amplifier circuit, the first mixer circuit, and the analog-to-digital conversion circuit to be operated in the first, the second, the third, or the fourth mode.

According to some embodiments, the dual-mode wireless transceiver device is adapted to be selectively coupled to a first antenna or a second antenna. In the first mode, the transceiver control circuit transmits the output signal as a first transmit signal by using the first antenna. In the second mode, the transceiver control circuit transmits the output signal as a second transmit signal by using the second antenna. In the third mode, the transceiver control circuit receives the first external signal and transfers the first external signal to the second mixer circuit by using the first antenna. In the fourth mode, the transceiver control circuit receives the second external signal and transfers the second external signal to the second mixer circuit by using the second antenna.

According to some embodiments, the filter amplifier circuit performs filtering according to a filtering parameter, and performs amplification according to a rate parameter, wherein in the first, the second, the third, and the fourth mode, the filter amplifier circuit has a corresponding first, second, third, and fourth rate as the rate parameter, and the filtering parameter is a preset filtering band.

According to some embodiments, the filter amplifier circuit includes a matching resistor group, a matching capacitor group, and an operation amplification circuit. The matching resistor group has a first, second, third, fourth impedance ratio corresponding to the first, the second, the third, and the fourth rate. The matching capacitor group has a capacitance value, wherein the capacitance value corresponds to the filtering band. The operation amplification circuit is connected to the matching capacitor group in parallel and electrically connected to the matching resistor group, wherein the operation amplification circuit selectively amplifies the corresponding input analog signal or the intermediate-frequency signal at the first, the second, the third, and the fourth rate according to control of the transceiver control circuit, to output the processed signal.

According to some embodiments, a wireless transceiver device includes an operation amplification circuit, a transmitter circuit, a receiver circuit, and a transceiver control circuit. The operation amplification circuit filters and amplifies an input signal according to a rate parameter and a filtering parameter and outputs the signal. The transmitter circuit performs digital-to-analog conversion processing, performs filtering and amplification by using the operation amplification circuit, and performs first mixing on the input signal by using the first or the second rate as the rate parameter selectively, to output an output signal. The receiver circuit performs second mixing, performs filtering and amplification by using the operation amplification circuit, and performs analog-to-digital conversion processing on an external signal by using the third or the fourth rate as the rate parameter selectively, to output a digital signal. The transceiver control circuit selectively and electrically connects the operation amplification circuit to the transmitter circuit or the receiver circuit.

According to some embodiments, the transmitter circuit includes a digital-to-analog conversion circuit and a first mixer circuit. The digital-to-analog conversion circuit is adapted to perform digital-to-analog conversion on the input signal and convert the input signal into an input analog signal, wherein the operation amplification circuit filters and amplifies the input analog signal. The first mixer circuit is adapted to mix the filtered and amplified input analog signal to output the output signal. The receiver circuit includes a second mixer circuit and an analog-to-digital conversion circuit. The second mixer circuit is adapted to mix the external signal to output an intermediate-frequency signal, wherein the operation amplification circuit filters and amplifies the intermediate-frequency signal. The analog-to-digital conversion circuit is adapted to perform analog-to-digital conversion on the filtered and amplified intermediate-frequency signal and convert the signal into the digital signal.

According to some embodiments, the transmitter circuit includes a first mother resistor, a second mother resistor, a first child resistor, and a second child resistor, and the transceiver control circuit controls the transmitter circuit to selectively connect the first or the second mother resistor between the digital-to-analog conversion circuit and the operation amplification circuit, and selectively connect the first or the second child resistor to the operation amplification circuit in parallel. The receiver circuit includes a third mother resistor, a fourth mother resistor, a third child resistor, and a fourth child resistor, and the transceiver control circuit controls the receiver circuit to selectively connect the third or the fourth mother resistor between the second mixer circuit and the operation amplification circuit, and selectively connect the third or the fourth child resistor to the operation amplification circuit in parallel.

According to some embodiments, the dual-mode wireless transceiver device additionally includes a capacitor, wherein the capacitor is connected to the operation amplification circuit in parallel, and a capacitance value of the capacitor is the filtering parameter.

In conclusion, the dual-mode wireless transceiver device is adapted to receive and transmit signals of two different wireless communications technology standards.

DETAILED DESCRIPTION

Figure 1:
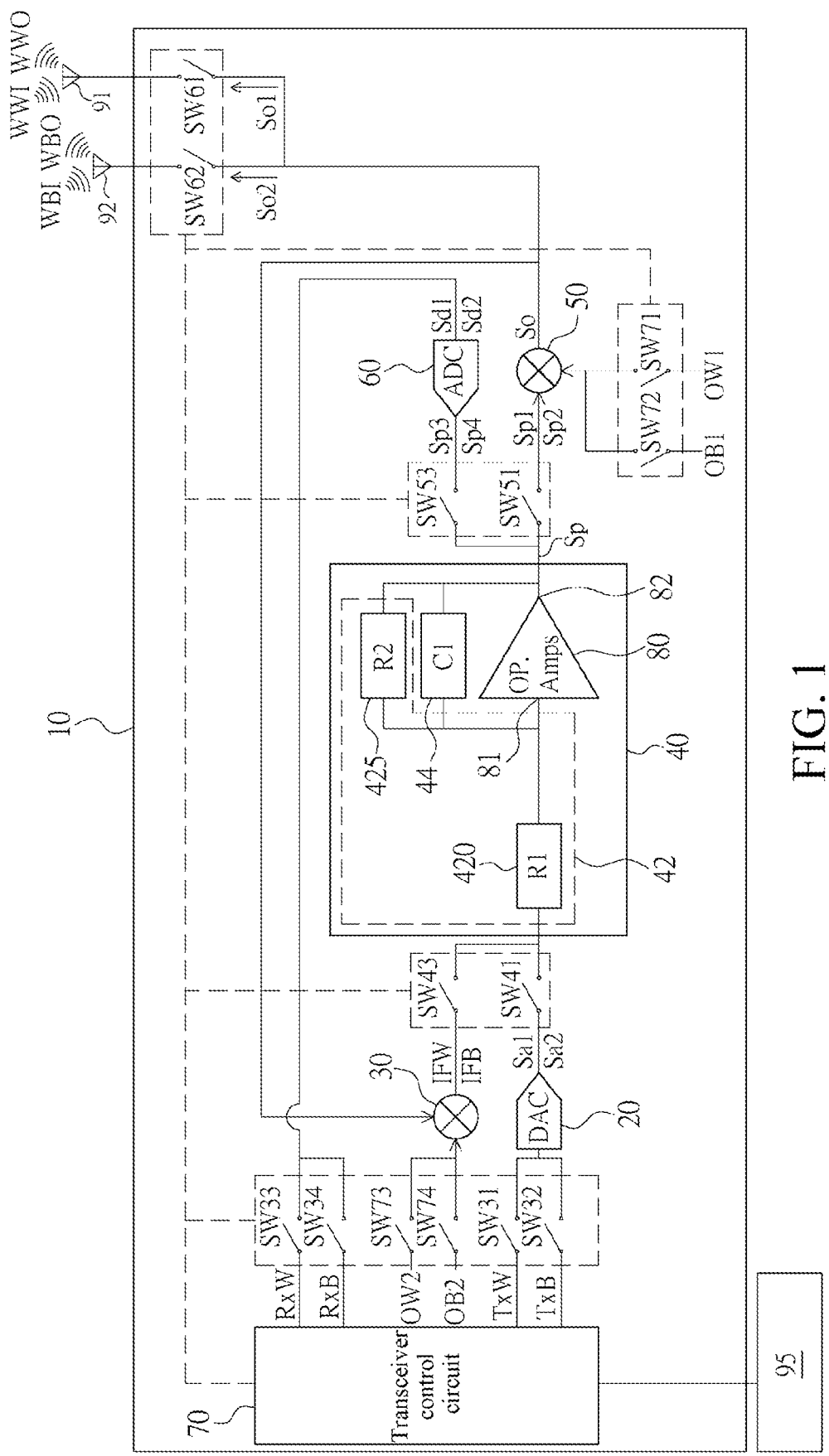
FIG. 1 is a schematic block diagram of a circuit in an embodiment of a dual-mode wireless transceiver device according to this disclosure.

Referring to FIG. 1, FIG. 1 is a schematic block diagram of a circuit in an embodiment of a dual-mode wireless transceiver device 10 according to this disclosure. The dual-mode wireless transceiver device 10 includes a digital-to-analog conversion circuit 20, a second mixer circuit 30, a filter amplifier circuit 40, a first mixer circuit 50, an analog-to-digital conversion circuit 60, and a transceiver control circuit 70.

The dual-mode wireless transceiver device 10 may be applied to a device having a wireless communication capability, for example but not limited to, a mobile device, a notebook computer, a tablet, and a digital camera. The device having a wireless communication capability has a communication control circuit 95, and the communication control circuit 95 is electrically connected to the dual-mode wireless transceiver device 10.

The dual-mode wireless transceiver device 10 is configured to receive and transmit wireless signals of two different standards. The two different wireless signals may be but is not limited to a wireless area network (Wi-Fi) and Bluetooth (Bluetooth). The wireless area network and Bluetooth mainly use the wireless communications technology of the 2.4-GHz band, which is a band that can be used without authorization.

In some embodiments, the dual-mode wireless transceiver device 10 is selectively coupled to a first antenna 91 and a second antenna 92. The first antenna 91 is adapted to receive and transmit a first wireless signal (to be described below), for example but not limited to Wi-Fi; and the second antenna 92 is adapted to receive and transmit a second wireless signal (to be described below), for example but not limited to Bluetooth. Specifically, when receiving a signal in a Wi-Fi mode, the first antenna 91 receives a first external signal WWI, and transfers the first external signal WWI to the dual-mode wireless transceiver device 10; when transmitting a signal in the Wi-Fi mode, the dual-mode wireless transceiver device 10 transmits a first transmit signal WWO by using the first antenna 91; when receiving a signal in a Bluetooth mode, the second antenna 92 receives a second external signal WBI, and transfers the second external signal WBI to the dual-mode wireless transceiver device 10; and when transmitting a signal in the Bluetooth mode, the second antenna 92 transmits a second transmit signal WBO.

The transceiver control circuit 70 controls the entire dual-mode wireless transceiver device 10 to be selectively operated in a first mode, a second mode, a third mode, or a fourth mode. At one time point, the dual-mode wireless transceiver device 10 is operated in only one of the four modes. In some embodiments, the first mode is a Wi-Fi transmit mode, the second mode is a Bluetooth transmit mode, the third mode is a Wi-Fi receive mode, and the fourth mode is a Bluetooth receive mode. This is used as an example for description below, but is not intended to limit the patent scope of this disclosure.

In some embodiments, the communication control circuit 95 determines and controls the transceiver control circuit 70 and the dual-mode wireless transceiver device 10 to be operated in the first mode, the second mode, the third mode, or the fourth mode. In the first mode, the dual-mode wireless transceiver device 10 processes a first input signal TxW transferred by the communication control circuit 95, and transmits the first input signal TxW out by using the first antenna 91; in the second mode, the dual-mode wireless transceiver device 10 processes a second input signal TxB transferred by the communication control circuit 95, and transmits the second input signal TxB out by using the second antenna 92; in the third mode, the dual-mode wireless transceiver device 10 processes a first external signal WWI received by the first antenna 91, and transfers the first external signal WWI to the communication control circuit 95; and in the fourth mode, the dual-mode wireless transceiver device 10 processes a second external signal WBI received by the second antenna 92, and transfers the second external signal WBI to the communication control circuit 95.

The digital-to-analog conversion circuit 20 is adapted to be operated in the first mode and the second mode. In the first mode, the digital-to-analog conversion circuit 20 is configured to convert the first input signal TxW into an input analog signal Sa; and in the second mode, the digital-to-analog conversion circuit 20 is configured to convert the second input signal TxB into the input analog signal Sa. In some embodiments, the first and the second input signals TxW and TxB are from the transceiver control circuit. The first input signal TxW is, but not limited to, a Wi-Fi signal, and the second input signal TxB may be, but not limited to, a Bluetooth signal. Further, in the first mode, the digital-to-analog conversion circuit 20 is configured to convert the first input signal TxW into a first input analog signal Sa1; and in the second mode, the digital-to-analog conversion circuit 20 is configured to convert the second input signal TxB into a second input analog signal Sa2.

The second mixer circuit 30 is adapted to be operated in a third mode and a fourth mode. In the third mode, the second mixer circuit 30 is configured to mix a first external signal WWI and a third local frequency OW2 to output an intermediate-frequency signal; and in the fourth mode, the second mixer circuit 30 is configured to mix a second external signal WBI and a fourth local frequency OB2 to output the intermediate-frequency signal. In some embodiments, in the third mode, the first external signal WWI is a Wi-Fi signal from the first antenna, the third local frequency OW2 is a frequency at which the Wi-Fi external signal WWI is adapted to be mixed into a first intermediate-frequency signal IFW, and the third local frequency OW2 is, for example but not limited to, 2412 MHz. In the fourth mode, the second external signal WBI is a Bluetooth signal from the second antenna, the fourth local frequency OB2 is a frequency at which the Bluetooth external signal WBI is adapted to be mixed into a second intermediate-frequency signal IFB, and the fourth local frequency OB2 is, for example but not limited to, 2436 MHz.

The filter amplifier circuit 40 is adapted to be operated in the first, the second, the third, and the fourth mode. In the first and the second mode, the filter amplifier circuit 40 is configured to filter and amplify the input analog signal Sa to output a processed signal Sp. In the third and the fourth mode, the filter amplifier circuit 40 is configured to filter and amplify the intermediate-frequency signals IFW and IFB to output the processed signal Sp. Specifically, in the first mode, the filter amplifier circuit 40 filters and amplifies the first input analog signal Sa1 to output a first processed signal Sp1; in the second mode, the filter amplifier circuit 40 filters and amplifies the second input analog signal Sa2 to output a second processed signal Sp2; in the third mode, the filter amplifier circuit 40 filters and amplifies the first intermediate-frequency signal IFW to output a third processed signal Sp3; and in the fourth mode, the filter amplifier circuit 40 filters and amplifies the second intermediate-frequency signal IFB to output a fourth processed signal Sp4.

The first mixer circuit 50 is adapted to be operated in the first and the second mode. In the first mode, the first mixer circuit 50 is configured to mix the processed signal Sp and a first local frequency OW1 to output an output signal So. In the second mode, the first mixer circuit 50 is configured to mix the processed signal Sp and a second local frequency OB1 to output the output signal So. Specifically, in the first mode, the first mixer circuit 50 is configured to mix the first processed signal Sp1 and the first local frequency OW1 to output a first output signal So1; and in the second mode, the first mixer circuit 50 is configured to mix the second processed signal Sp2 and the second local frequency OB1 to output a second output signal So2.

The analog-to-digital conversion circuit 60 is adapted to be operated in the third and the fourth mode, and the analog-to-digital conversion circuit 60 is configured to convert the processed signal Sp into a digital signal Sd. Specifically, in the third mode, the analog-to-digital conversion circuit 60 converts the third processed signal Sp3 into a digital signal Sd1 (that is, a first receive signal RxW); in the fourth mode, the analog-to-digital conversion circuit 60 converts the fourth processed signal Sp4 into a digital signal Sd2 (that is, a second receive signal RxB).

The transceiver control circuit 70 is configured to control the digital-to-analog conversion circuit 20, the second mixer circuit 30, the filter amplifier circuit 40, the first mixer circuit 50, and the analog-to-digital conversion circuit 60, so that the dual-mode wireless transceiver device 10 is operated in the first, the second, the third, or the fourth mode.

According to the foregoing embodiments, the dual-mode wireless transceiver device 10 is operated to receive and transmit wireless signals of two different communication standards. When the dual-mode wireless transceiver device 10 is operated in the first mode, after digital-to-analog conversion, filtering and amplification, and mixing is performed on the first input signal TxW, the first transmit signal WWO is obtained and transmitted by the first antenna 91. When the dual-mode wireless transceiver device 10 is operated in the second mode, after digital-to-analog conversion, filtering and amplification, and mixing is performed on the second input signal TxB, the second transmit signal WBO is obtained and transmitted by the second antenna 92. When the dual-mode wireless transceiver device 10 is operated in the third mode, after mixing, filtering and amplification, and analog-to-digital conversion is performed on the first external signal So1 from the first antenna 91, the first receive signal RxW is output. When the dual-mode wireless transceiver device 10 is operated in the fourth mode, after mixing, filtering and amplification, and analog-to-digital conversion is performed on the second external signal So2 from the second antenna 92, the second receive signal RxB is output.

In the first mode, the transceiver control circuit 70 transmits the output signal as a first transmit signal WWO by using the first antenna 91; in the second mode, the transceiver control circuit 70 transmits the output signal as a second transmit signal WBO by using the second antenna 92; in the third mode, the transceiver control circuit 70 receives the first external signal WWI by using the antenna 91 and transfers the first external signal WWI to the second mixer circuit 30; and in the fourth mode, the transceiver control circuit 70 receives the second external signal WBI by using the second antenna 92 and transfers the second external signal WBI to the second mixer circuit 30.

The filter amplifier circuit 40 performs filtering according to a filtering parameter, and performs amplification according to a rate parameter. In some embodiments, the rate parameter is a magnificent rate. In the first, the second, the third, and the fourth mode, the filter amplifier circuit 40 has a corresponding first, second, third, and fourth rate as the rate parameter, and the filtering parameter is a preset filtering band.

Still referring to FIG. 1, the filter amplifier circuit includes a matching resistor group 42, a matching capacitor group 44, and an operation amplification circuit 80. The matching resistor group 42 has a first, a second, a third, and a fourth impedance ratio corresponding to the first, the second, the third, and the fourth rate. The matching capacitor group 44 has a capacitance value, and the capacitance value corresponds to a filtering band.

The operation amplification circuit 80 is connected to the matching capacitor group 44 in parallel and electrically connected to the matching resistor group 42. The operation amplification circuit 80 amplifies the corresponding input analog signals Sa1 and Sa2 or the intermediate-frequency signals IFW and IFB at the first, the second, the third, and the fourth rate selectively according to control of the transceiver control circuit 70, to output the processed signals Sp1, Sp2, Sp3, and Sp4.

Specifically, the operation amplification circuit 80 has an input end 81 and an output end 82, and two ends of the matching capacitor group 44 are respectively connected to the input end 81 and the output end 82, that is, the matching capacitor group 44 is connected to the operation amplification circuit 80 in parallel. Therefore, when the filter amplifier circuit 40 operates, the matching capacitor group 44 can perform filtering processing on the filtering band corresponding to the matching capacitor group 44. In some embodiments, the operation amplification circuit 80 is an operational amplifier.

The filtering band of the matching capacitor group 44 may be determined according to features of the first input analog signal Sa1, the second input analog signal Sa2, the first intermediate-frequency signal IFW, and the second intermediate-frequency signal IFB that need to be filtered. The matching capacitor group 44 may be one capacitor, or may be a plurality of capacitors connected in series and/or in parallel. In some embodiments, the filtering band of the matching capacitor group 44 varies as features of the first input analog signal Sa1, the second input analog signal Sa2, the first intermediate-frequency signal IFW, and the second intermediate-frequency signal IFB that need to be filtered vary. The matching capacitor group 44 may include a plurality of capacitors connected in series and/or in parallel and a plurality of switches. The transceiver controller 70 controls the switches of the matching capacitor group 44 according to the first, the second, the third, or the fourth mode that the dual-mode wireless transceiver device 10 is operated in, so that the capacitance value of the matching capacitor group 44 respectively corresponds to the filtering band needed in the first, the second, the third, or the fourth mode.

The matching resistor group 42 includes a first resistor group 420 (R1) and a second resistor group 425 (R2). The first resistor group 420 is connected between the digital-to-analog conversion circuit 20 and the input end 81 of the operation amplification circuit 80, the second resistor group 425 is connected to the operation amplification circuit 80 in parallel (that is, two ends of the second resistor group 425 are respectively connected to the input end 81 of the operation amplification circuit 80 and the output end 82), and the transceiver control circuit 70 controls an impedance value of the first resistor group 420 and an impedance value of the second resistor group 425 according to the first, the second, the third, and the fourth mode, so that a quotient obtained by dividing the impedance value of the second resistor group 425 by the impedance value of the first resistor group 420 corresponds to the first, the second, the third, and the fourth rate (that is, corresponds to the first, the second, the third, and the fourth impedance ratio). In other words, a quotient obtained by dividing the impedance value of the second resistor group 425 by the impedance value of the first resistor group 420 corresponds to the first, the second, the third, and the fourth impedance ratio. "Corresponding to" herein means "approximately the same" rather than "the same". That is, a quotient obtained by dividing the impedance value of the second resistor group 425 by the impedance value of the first resistor group 420 is approximately the same as the first, the second, the third, or the fourth impedance ratio. "Approximately" herein may include an error of approximately 20%. The first, the second, the third, and the fourth rate may be the same or different, and are determined according to a ratio at which a signal is amplified in each mode.

In some embodiments, the first resistor group 420 and the second resistor group 425 may be, but are not limited to, variable resistors or digital variable resistors. The transceiver control circuit 70 controls the impedance value of the first resistor group 420 and the impedance value of the second resistor group 425 according to the first, the second, the third, and the fourth mode, and generates the corresponding first, second, third, and fourth impedance ratio.

Figure 2:
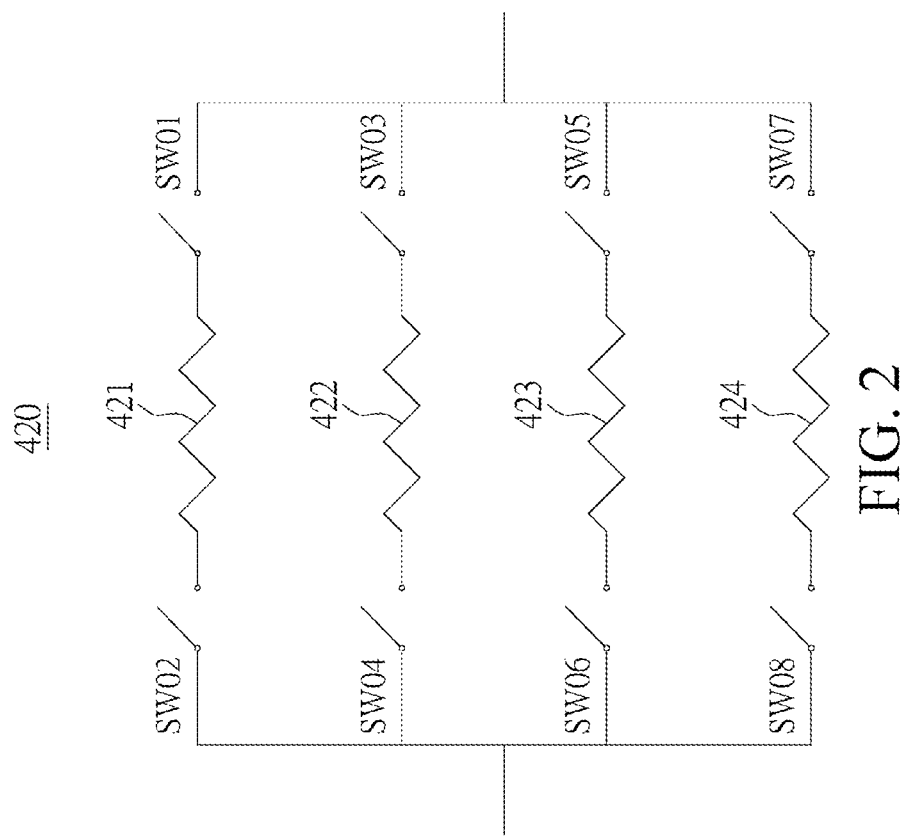
FIG. 2 is a schematic block diagram of a circuit in an embodiment of a first resistor group according to this disclosure.
Figure 3:
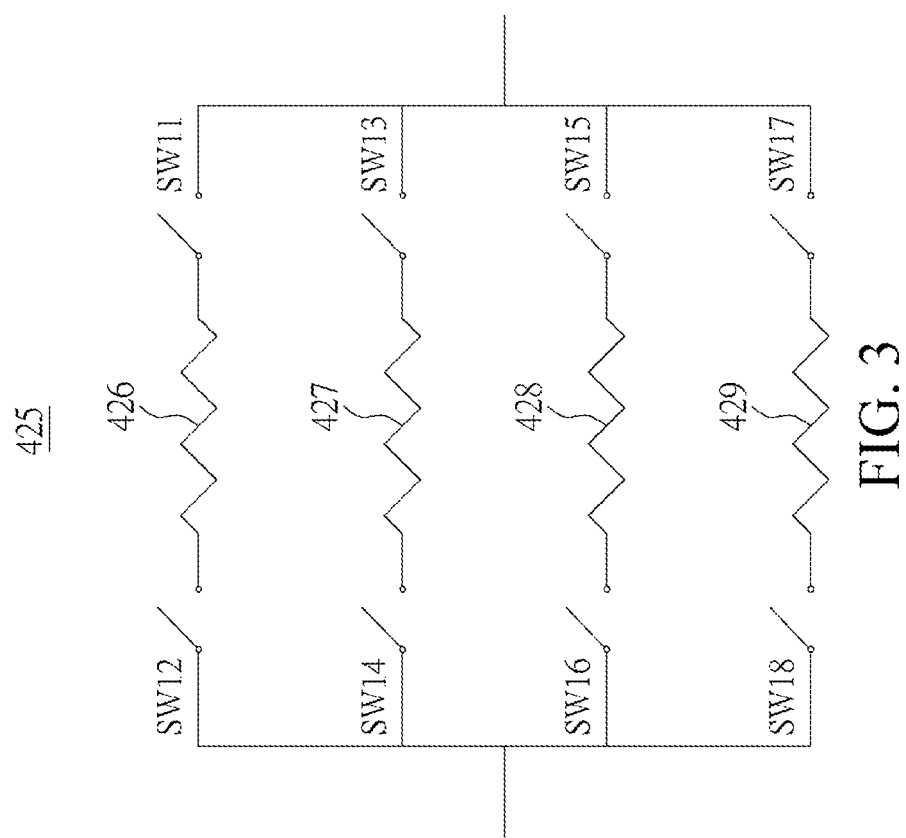
FIG. 3 is a schematic block diagram of a circuit in an embodiment of a second resistor group according to this disclosure.

In some embodiments, referring to FIG. 2 and FIG. 3, the first resistor group 420 includes a first mother resistor 421, a second mother resistor 422, a third mother resistor 423, and a fourth mother resistor 424, the second resistor group 425 includes a first child resistor 426, a second child resistor 427, a third child resistor 428, and a fourth child resistor 429, the transceiver control circuit 70 controls the first resistor group 420 and the second resistor group 425, so that selectively, a quotient obtained by dividing a resistance value of the first child resistor 426 by a resistance value of the first mother resistor 421 corresponds to the first rate, a quotient obtained by dividing a resistance value of the second child resistor 427 by a resistance value of the second mother resistor 422 corresponds to the second rate, a quotient obtained by dividing a resistance value of the third child resistor 428 is divided by a resistance value of the third mother resistor 423 corresponds to the third rate, and a quotient obtained by dividing a resistance value of the fourth child resistor 429 is divided by a resistance value of the fourth mother resistor 424 corresponds to the fourth rate.

It may be learned from FIG. 2 and FIG. 3 that, two ends of each mother resistor 421, 422, 423, and 424 and each child resistor 426, 427, 428, and 429 are connected to switches SW 01, SW 02, SW 03, SW 04, SW 05, SW 06, SW 07, SW 08, SW 11, SW 12, SW 13, SW 14, SW 15, SW 16, SW 17, and SW 18. In the first mode, the transceiver control circuit 70 controls the switches SW 01, SW 02, SW 11, and SW 12 to be on, and controls the remaining switches SW 03, SW 04, SW 05, SW 06, SW 07, SW 08, SW 13, SW 14, SW 15, SW 16, SW 17, and SW 18 to be off, so that the first mother resistor 421 is connected between the input end of the operation amplification circuit 80 and the digital-to-analog conversion circuit 20, and the first child resistor 426 is connected to the operation amplification circuit 80 in parallel. Therefore, the rate parameter is the quotient obtained by dividing the resistance value of the first child resistor 426 by the resistance value of the first mother resistor 421.

In the second mode, the transceiver control circuit 70 controls the switches SW 03, SW 04, SW 13, and SW 14 to be on, and controls the remaining switches SW 01, SW 02, SW 05, SW 06, SW 07, SW 08, SW 11, SW 12, SW 15, SW 16, SW 17, and SW 18 to be off, so that the second mother resistor 422 is connected between the input end of the operation amplification circuit 80 and the digital-to-analog conversion circuit 20, and the second child resistor 427 is connected to the operation amplification circuit 80 in parallel. Therefore, the rate parameter is the quotient obtained by dividing the resistance value of the second child resistor 427 by the resistance value of the second mother resistor 422.

In the third mode, the transceiver control circuit 70 controls the switches SW 05, SW 06, SW 15, and SW 16 to be on, and controls the remaining switches SW 01, SW 02, SW 03, SW 04, SW 07, SW 08, SW 11, SW 12, SW 13, SW 14, SW 17, and SW 18 to be off, so that the third mother resistor 423 is connected between the input end of the operation amplification circuit 80 and the digital-to-analog conversion circuit 20, and the third child resistor 428 is connected to the operation amplification circuit 80 in parallel. Therefore, the rate parameter is the quotient obtained by dividing the resistance value of the third child resistor 428 by the resistance value of the third mother resistor 423.

In the fourth mode, the transceiver control circuit 70 controls the switches SW 07, SW 07, SW 17, and SW 18 to be on, and controls the remaining switches SW 01, SW 02, SW 03, SW 04, SW 05, SW 06, SW 11, SW 12, SW 13, SW 14, SW 15, and SW 16 to be off, so that the fourth mother resistor 424 is connected between the input end of the operation amplification circuit 80 and the digital-to-analog conversion circuit 20, and the fourth child resistor 429 is connected to the operation amplification circuit 80 in parallel. Therefore, the rate parameter is the quotient obtained by dividing the resistance value of the fourth child resistor 429 by the resistance value of the fourth mother resistor 424.

The first resistor group 420 includes four child resistors 421, 422, 423, and 424 that are connected in parallel, and the second resistor group 425 includes four mother resistors 426, 427, 428, and 429 that are connected in parallel. In some embodiments, the first resistor group 420 and the second resistor group 425 may alternatively form an appropriate impedance value and a corresponding rate in other forms.

In the foregoing embodiments, the switches SW 01, SW 02, SW 03, SW 04, SW 05, SW 06, SW 07, SW 08, SW 11, SW 12, SW 13, SW 14, SW 15, SW 16, SW 17, and SW 18 are respectively configured at front and rear ends (two ends) of each of the child resistors 421, 422, 423, and 424 and each of the mother resistors 426, 427, 428, and 429. In some embodiments, a switch SW may be configured at one end (a single end) of each of the child resistors 421, 422, 423, and 424 and each of the mother resistors 426, 427, 428, and 429.

Still referring to FIG. 1, dashed lines between the transceiver control circuit 70 and the switches in FIG. 1 are schematic diagrams of controlling the switches by the transceiver control circuit 70.

When the dual-mode wireless transceiver device 10 is operated in the first mode (for example, the Wi-Fi transmit mode), the transceiver control circuit 70 controls the switches SW 31, SW 41, SW 51, SW 61, and SW 71 to be on, and controls the remaining switches (the other switches in FIG. 1 which are not listed one by one) to be off (not conducted). Therefore, the dual-mode wireless transceiver device 10 converts the first input signal TxW transferred by the communication control circuit 95 into the first analog input signal Sa1 by using the digital-to-analog conversion circuit 20, and filters and amplifies the first analog input signal Sa1 by using the filter amplifier circuit 40 to output the first processed signal Sp1. The first mixer circuit 50 mixes the first processed signal Sp1 and the first local frequency OW1 to output the first output signal So1, and the first antenna 91 transmits the first output signal So1 as the first transmit signal WWO.

When the dual-mode wireless transceiver device 10 is operated in the second mode (for example, the Bluetooth transmit mode), the transceiver control circuit 70 controls the switches SW 32, SW 41, SW 51, SW 62, and SW 72 to be on, and controls the remaining switches (the other switches in FIG. 1 which are not listed one by one) to be off (not conducted). Therefore, the dual-mode wireless transceiver device 10 converts the second input signal TxB transferred by the communication control circuit 95 into the second analog input signal Sa2 by using the digital-to-analog conversion circuit 20, and filters and amplifies the second analog input signal Sa2 by using the filter amplifier circuit 40 to output the second processed signal Sp2. The first mixer circuit 50 mixes the second processed signal Sp2 and the second local frequency OB1 to output the second output signal So2, and the second antenna 92 transmits the second output signal So2 as the second transmit signal WBO.

When the dual-mode wireless transceiver device 10 is operated in the third mode (for example, a Wi-Fi receive mode), the transceiver control circuit 70 controls the switches SW 61, SW 73, SW 43, SW 53, and SW 33 (the numbers are arranged according to a signal inflow path sequence) to be on, and controls the remaining switches (other switches in FIG. 1 which are not listed one by one) to be off (not conducted). After the dual-mode wireless transceiver device 10 transfers the first external signal WWI received by the first antenna 91 to the second mixer circuit 30, and the second mixer circuit 30 mixes the first external signal WWI and the third local frequency OW2, the dual-mode wireless transceiver device 10 outputs the first intermediate-frequency signal IFW. The filter amplifier circuit 40 filters and amplifies the first intermediate-frequency signal IFW to output the third processed signal Sp3. The analog-to-digital conversion circuit 60 converts the third processed signal Sp3 into the digital signal Sd1 (that is, the first receive signal RxW).

When the dual-mode wireless transceiver device 10 is operated in the fourth mode (for example, a Bluetooth receive mode), the transceiver control circuit 70 controls the switches SW 62, SW 74, SW 43, SW 53, and SW 34 (the numbers are arranged according to a signal inflow path sequence) to be on, and controls the remaining switches (other switches in FIG. 1 which are not listed one by one) to be off (not conducted). After the dual-mode wireless transceiver device 10 transfers the second external signal WBI received by the first antenna 92 to the second mixer circuit 30, and the second mixer circuit 30 mixes the second external signal WBI and the fourth local frequency OB2, the dual-mode wireless transceiver device 10 filters and amplifies the second intermediate-frequency signal IFB to output the second intermediate-frequency signal IFB. The filter amplifier circuit 40 outputs the fourth processed signal Sp4. The analog-to-digital conversion circuit 60 converts the fourth processed signal Sp4 into the digital signal Sd2 (that is, the second receive signal RxB).

It may be learned from the foregoing description that the dual-mode wireless transceiver device 10 may be operated in different modes at different time points. In some embodiments, the transceiver control circuit 70 may be switched between the modes, and a buffer time is reserved to provide that the elements of the dual-mode wireless transceiver device 10 are cleared or started, thereby achieving a better operational effect.

In some embodiments, the first local frequency OW1 and the third local frequency OW2 may be of a same frequency, and the second local frequency OB1 and the fourth local frequency OB2 may be of a same frequency. Each of the first local frequency OW1, the second local frequency OB1, the third local frequency OW2, and the fourth local frequency OB2 may be from an oscillator (not shown). In some embodiments, the oscillator may be a part of the transceiver control circuit 70.

Figure 4:
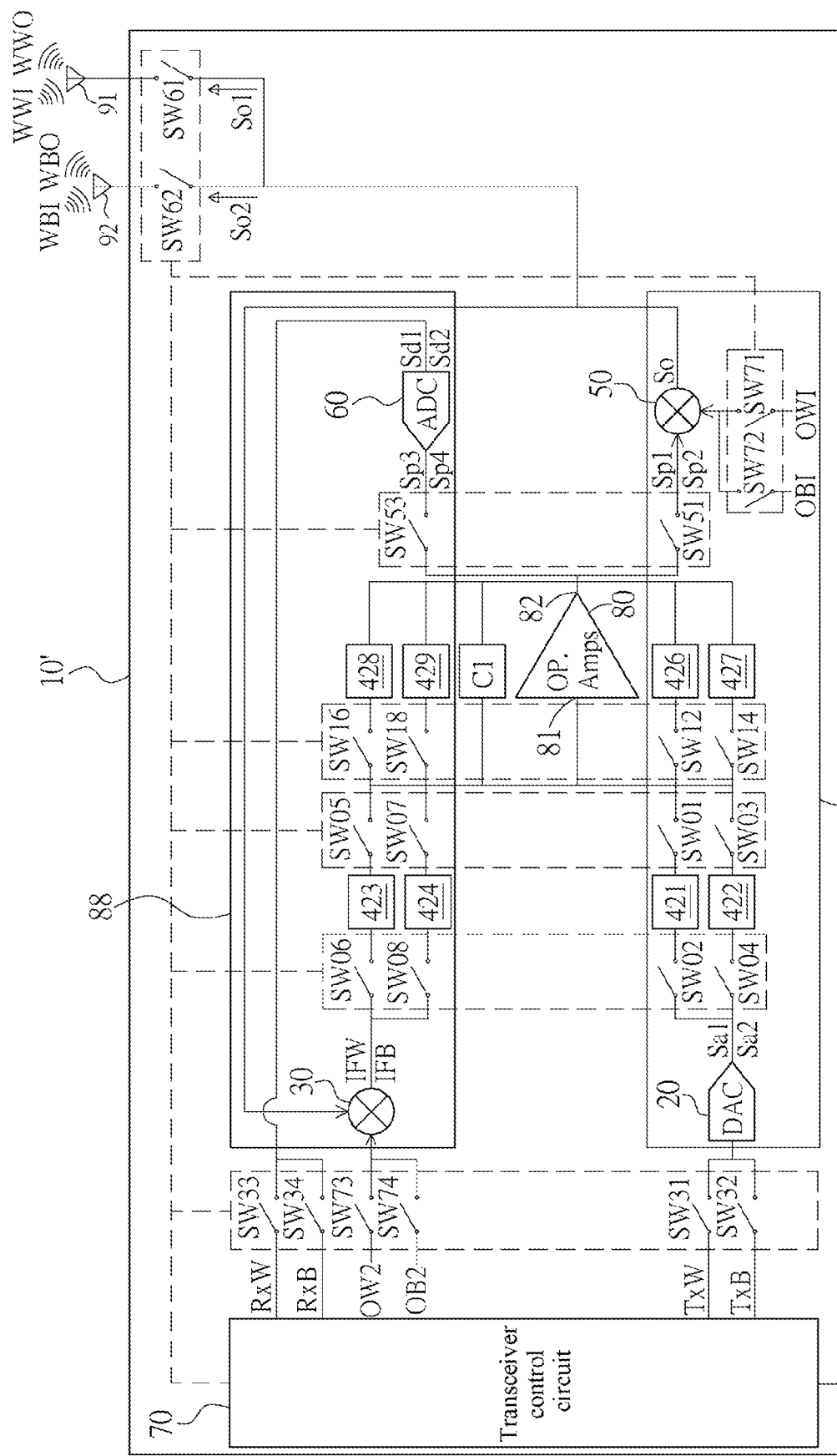
FIG. 4 is a schematic block diagram of a circuit in another embodiment of a dual-mode wireless transceiver device according to this disclosure.

Referring to FIG. 4, FIG. 4 is a schematic block diagram of a circuit in another embodiment of a dual-mode wireless transceiver device 10' according to this disclosure. The dual-mode wireless transceiver device 10' includes an operation amplification circuit 80, a transmitter circuit 86, a receiver circuit 88, and a transceiver control circuit 70.

The operation amplification circuit 80 has an input end 81 and an output end 82, where after the operation amplification circuit 80 filters and amplifies, according to a rate parameter and a filtering parameter, signal inputs from the input end, the operation amplification circuit outputs the signals from the output end.

The transmitter circuit 86 has a first rate and a second rate, where the transmitter circuit 86 performs digital-to-analog conversion processing, performs filtering and amplification by using the operation amplification circuit 80, and performs first mixing on the input signals TxW and TxB by using the first or the second rate as the rate parameter selectively, to output output signals So1 and So2.

The receiver circuit 88 has a third rate and a fourth rate, where the receiver circuit 88 performs second mixing, performs filtering and amplification by using the operation amplification circuit 80 and performs analog-to-digital conversion processing on external signals WWI and WBI by using the third or the fourth rate as the rate parameter selectively, to output digital signals Sd1 and Sd2.

The transceiver control circuit 70 selectively and electrically connects the operation amplification circuit 80 to the transmitter circuit 86 or the receiver circuit 88.

Therefore, when the transceiver control circuit 70 electrically connecting the operation amplification circuit 70 to the transmitter circuit 86, the dual-mode wireless transceiver device 10' may selectively process a first input signal TxW or a second input signal TxB, to transmit a first transmit signal WWO or a second transmit signal WBO.

When the transceiver control circuit 70 electrically connecting the operation amplification circuit 70 to the receiver circuit 88, the dual-mode wireless transceiver device 10' may selectively process a first external signal WWI or a second external signal WBI, to output a first receive signal RxW or a second receive signal RxB.

Still referring to FIG. 4, the transmitter circuit 86 includes a digital-to-analog conversion circuit 20 and a first mixer circuit 50. The digital-to-analog conversion circuit 20 is adapted to perform digital-to-analog conversion on the input signals TxW and TxB and convert the input signals into input analog signals Sa1 and Sa2, where the operation amplification circuit 80 filters and amplifies the input analog signals Sa1 and Sa2. The first mixer circuit 50 is adapted to mix the filtered and amplified input analog signal (that is, Sp1 and Sp2), to output the output signal So1 and So2.

The receiver circuit 88 includes a second mixer circuit 30 and an analog-to-digital conversion circuit 60. The second mixer circuit 30 is adapted to mix the external signals WWI and WBI to output intermediate-frequency signals IFW and IFB, where the operation amplification circuit 80 filters and amplifies the intermediate-frequency signals IFW and IFB. The analog-to-digital conversion circuit 60 is adapted to perform analog-to-digital conversion on the filtered and amplified intermediate-frequency signals (that is, Sp3 and Sp4) and convert the signals into the digital signals Sd1 and Sd2.

In some embodiments, the transmitter circuit 86 includes a first mother resistor 421, a second mother resistor 422, a first child resistor 426, and a second child resistor 427, and the transceiver control circuit 70 controls the transmitter circuit 86 to selectively connect the first mother resistor 421 or the second mother resistor 422 between the digital-to-analog conversion circuit 20 and the operation amplification circuit 80, and selectively connect the first child resistor 426 or the second child resistor 427 to the operation amplification circuit in parallel. Therefore, the rate parameter of the operation amplification circuit 80 may be selectively a quotient obtained by dividing a resistance value of the first child resistor 426 by a resistance value of the first mother resistor 421, or a quotient obtained by dividing a resistance value of the second child resistor 427 by a resistance value of the second mother resistor 422.

The receiver circuit 88 includes a third mother resistor 423, a fourth mother resistor 424, a third child resistor 428, and a fourth child resistor 429, the transceiver control circuit 70 controls the transmitter circuit 88 to selectively connect the third mother resistor 423 or the fourth mother resistor 424 between the second mixer circuit 30 and the operation amplification circuit 80, and selectively connect the third child resistor 428 or the fourth child resistor 429 to the operation amplification circuit in parallel. Therefore, the rate parameter of the operation amplification circuit 80 may be selectively a quotient obtained by dividing a resistance value of the third child resistor 428 by a resistance value of the third mother resistor 423, or a quotient obtained by dividing a resistance value of the fourth child resistor 429 by a resistance value of the fourth mother resistor 424.

Therefore, the transceiver control circuit 70 controls the switches SW 01, SW 02, SW 03, SW 04, SW 05, SW 06, SW 07, SW 08, SW 12, SW 14, SW 16, SW 18, SW 31, SW 32, SW 33, SW 34, SW 51, SW 53, SW 61, SW 62, SW 71, SW 72, SW 73, and SW 74 shown in FIG. 4, to enable that the dual-mode wireless transceiver device 10' is operated in the first, the second, the third, or the fourth mode. The numbers of the switches in FIG. 4 are the same as the numbers of the switches in FIG. 1, and control manners of the transceiver control circuit 70 are the same. Therefore, details are not described again.

In some embodiments, the dual-mode wireless transceiver device 10' additionally includes a capacitor 44 (C1), the capacitor 44 is connected to the operation amplification circuit 80 in parallel, and a capacitance value of the capacitor 44 is the filtering parameter.

In conclusion, the dual-mode wireless transceiver device according to this disclosure is adapted to receive and transmit signals of two different wireless communication standards, and by using a shared operation amplification circuit and a passive element, the entire dual-mode wireless transceiver device has a smaller area and relatively simplified circuit complexity.

What is claimed is:

1. A dual-mode wireless transceiver device, comprising:
a digital-to-analog conversion circuit, adapted to be operated in a first mode and a second mode, wherein in the first mode, the digital-to-analog conversion circuit is configured to convert a first input signal into an input analog signal; and in the second mode, the digital-to-analog conversion circuit is configured to convert a second input signal into the input analog signal;
a second mixer circuit, adapted to be operated in a third mode and a fourth mode, wherein in the third mode, the second mixer circuit is configured to mix a first external signal and a third local frequency to output an intermediate-frequency signal; and in the fourth mode, the second mixer circuit is configured to mix a second external signal and a fourth local frequency to output the intermediate-frequency signal;
a filter amplifier circuit, adapted to be operated in the first, the second, the third, and the fourth mode, wherein in the first and the second mode, the filter amplifier circuit is configured to filter and amplify the input analog signal to output a processed signal; and in the third and the fourth mode, the filter amplifier circuit is configured to filter and amplify the intermediate-frequency signal to output the processed signal;
a first mixer circuit, adapted to be operated in the first and the second mode, wherein in the first mode, the first mixer circuit is configured to mix the processed signal and a first local frequency to output an output signal; and in the second mode, the first mixer circuit is configured to mix the processed signal and a second local frequency to output the output signal;
an analog-to-digital conversion circuit, adapted to be operated in the third and the fourth mode, wherein the analog-to-digital conversion circuit is configured to convert the processed signal into a digital signal; and
a transceiver control circuit, configured to control the digital-to-analog conversion circuit, the second mixer circuit, the filter amplifier circuit, the first mixer circuit, and the analog-to-digital conversion circuit to be operated in the first, the second, the third, or the fourth mode.

2. The dual-mode wireless transceiver device according to claim 1, adapted to be selectively coupled to a first antenna or a second antenna, wherein the transceiver control circuit, in the first mode, transmits the output signal as a first transmit signal by using the first antenna; the transceiver control circuit, in the second mode, transmits the output signal as a second transmit signal by using the second antenna; the transceiver control circuit, in the third mode, receives the first external signal and transfers the first external signal to the second mixer circuit by using the first antenna; and the transceiver control circuit, in the fourth mode, receives the second external signal and transfers the second external signal to the second mixer circuit by using the second antenna.

3. The dual-mode wireless transceiver device according to claim 2, wherein the filter amplifier circuit performs filtering according to a filtering parameter, and performs amplification according to a rate parameter, wherein in the first, the second, the third, and the fourth mode, the filter amplifier circuit has a corresponding first, second, third, and fourth rate as the rate parameter, and the filtering parameter is a preset filtering band.

4. The dual-mode wireless transceiver device according to claim 3, wherein the filter amplifier circuit comprises:
a matching resistor group, having a first, second, third, fourth impedance ratio corresponding to the first, the second, the third, and the fourth rate;
a matching capacitor group, having a capacitance value, wherein the capacitance value corresponds to the filtering band; and
an operation amplification circuit, connected to the matching capacitor group in parallel and electrically connected to the matching resistor group, wherein the operation amplification circuit selectively amplifies the corresponding input analog signal or the intermediate-frequency signal at the first, the second, the third, and the fourth rate according to control of the transceiver control circuit, to output the processed signal.

5. The dual-mode wireless transceiver device according to claim 4, wherein the matching resistor group comprises a first resistor group and a second resistor group, the first resistor group is connected between the digital-to-analog conversion circuit and an input end of the operation amplification circuit, the second resistor group is connected to the operation amplification circuit in parallel, and in the first, the second, the third, and the fourth mode, the transceiver control circuit controls an impedance value of the first resistor group and an impedance value of the second resistor group, so that a quotient obtained by dividing the impedance value of the second resistor group by the impedance value of the first resistor group corresponds to the first, the second, the third, and the fourth rate.

6. The dual-mode wireless transceiver device according to claim 5, wherein the first resistor group comprises a first, a second, a third, and a fourth mother resistor, the second resistor group comprises a first, a second, a third, and a fourth child resistor, the transceiver control circuit controls the first and the second resistor group, so that selectively, a quotient obtained by dividing a resistance value of the first child resistor by a resistance value of the first mother resistor corresponds to the first rate, a quotient obtained by dividing a resistance value of the second child resistor by a resistance value of the second mother resistor corresponds to the second rate, a quotient obtained by dividing a resistance value of the third child resistor by a resistance value of the third mother resistor corresponds to the third rate, and a quotient obtained by dividing a resistance value of the fourth child resistor by a resistance value of the fourth mother resistor corresponds to the fourth rate.

7. The dual-mode wireless transceiver device according to claim 1, wherein the filter amplifier circuit performs filtering according to a filtering parameter, and performs amplification according to a rate parameter, wherein in the first, the second, the third, and the fourth mode, the filter amplifier circuit has a corresponding first, second, third, and fourth rate as the rate parameter, and the filtering parameter is a preset filtering band.

8. The dual-mode wireless transceiver device according to claim 7, wherein the filter amplifier circuit comprises:
a matching resistor group, having a first, second, third, fourth impedance ratio corresponding to the first, the second, the third, and the fourth rate;
a matching capacitor group, having a capacitance value, wherein the capacitance value corresponds to the filtering band; and
an operation amplification circuit, connected to the matching capacitor group in parallel and electrically connected to the matching resistor group, wherein the operation amplification circuit selectively amplifies the corresponding input analog signal or the intermediate-frequency signal at the first, the second, the third, and the fourth rate according to control of the transceiver control circuit, to output the processed signal.

9. The dual-mode wireless transceiver device according to claim 8, wherein the matching resistor group comprises a first resistor group and a second resistor group, the first resistor group is connected between the digital-to-analog conversion circuit and an input end of the operation amplification circuit, the second resistor group is connected to the operation amplification circuit in parallel, and in the first, the second, the third, and the fourth mode, the transceiver control circuit controls an impedance value of the first resistor group and an impedance value of the second resistor group, so that a quotient obtained by dividing the impedance value of the second resistor group by the impedance value of the first resistor group corresponds to the first, the second, the third, and the fourth rate.

10. The dual-mode wireless transceiver device according to claim 9, wherein the first resistor group comprises a first, a second, a third, and a fourth mother resistor, the second resistor group comprises a first, a second, a third, and a fourth child resistor, the transceiver control circuit controls the first and the second resistor group, so that selectively, a quotient obtained by dividing a resistance value of the first child resistor by a resistance value of the first mother resistor corresponds to the first rate, a quotient obtained by dividing a resistance value of the second child resistor by a resistance value of the second mother resistor corresponds to the second rate, a quotient obtained by dividing a resistance value of the third child resistor by a resistance value of the third mother resistor corresponds to the third rate, and a quotient obtained by dividing a resistance value of the fourth child resistor by a resistance value of the fourth mother resistor corresponds to the fourth rate.

11. A dual-mode wireless transceiver device, comprising:
an operation amplification circuit, having an input end and an output end, wherein after the operation amplification circuit filters and amplifies, according to a rate parameter and a filtering parameter, a signal input from the input end, the operation amplification circuit outputs the signal from the output end;
a transmitter circuit, having a first rate and a second rate, wherein the transmitter circuit performs digital-to-analog conversion processing, performs filtering and amplification by using the operation amplification circuit, and performs first mixing on the input signal by using the first or the second rate as the rate parameter selectively, to output an output signal;
a receiver circuit, having a third rate and a fourth rate, wherein the receiver circuit performs second mixing, performs filtering and amplification by using the operation amplification circuit, and performs analog-to-digital conversion processing on an external signal by using the third or the fourth rate as the rate parameter selectively, to output a digital signal; and
a transceiver control circuit, selectively and electrically connecting the operation amplification circuit to the transmitter circuit or the receiver circuit.

12. The dual-mode wireless transceiver device according to claim 11, wherein
the transmitter circuit comprises:
a digital-to-analog conversion circuit, adapted to perform digital-to-analog conversion on the input signal and convert the input signal into an input analog signal, wherein the operation amplification circuit filters and amplifies the input analog signal; and
a first mixer circuit, adapted to mix the filtered and amplified input analog signal to output the output signal; and
the receiver circuit comprises:
a second mixer circuit, adapted to mix the external signal to output an intermediate-frequency signal, wherein the operation amplification circuit filters and amplifies the intermediate-frequency signal; and
an analog-to-digital conversion circuit, adapted to perform analog-to-digital conversion on the filtered and amplified intermediate-frequency signal and convert the signal into the digital signal.

13. The dual-mode wireless transceiver device according to claim 12, wherein
the transmitter circuit comprises a first mother resistor, a second mother resistor, a first child resistor, and a second child resistor, and the transceiver control circuit controls the transmitter circuit to selectively connect the first or the second mother resistor between the digital-to-analog conversion circuit and the operation amplification circuit, and selectively connect the first or the second child resistor to the operation amplification circuit in parallel; and
the receiver circuit comprises a third mother resistor, a fourth mother resistor, a third child resistor, and a fourth child resistor, and the transceiver control circuit controls the receiver circuit to selectively connect the third or the fourth mother resistor between the second mixer circuit and the operation amplification circuit, and selectively connect the third or the fourth child resistor to the operation amplification circuit in parallel.

14. The dual-mode wireless transceiver device according to claim 13, additionally comprising a capacitor, wherein the capacitor is connected to the operation amplification circuit in parallel, and a capacitance value of the capacitor is the filtering parameter.

15. The dual-mode wireless transceiver device according to claim 12, additionally comprising a capacitor, wherein the capacitor is connected to the operation amplification circuit in parallel, and a capacitance value of the capacitor is the filtering parameter.

16. The dual-mode wireless transceiver device according to claim 11, additionally comprising a capacitor, wherein the capacitor is connected to the operation amplification circuit in parallel, and a capacitance value of the capacitor is the filtering parameter.

* * * * *